United States Patent [19]

Schlangenotto et al.

[11] 4,243,998
[45] Jan. 6, 1981

[54] SAFETY CIRCUIT FOR A SEMICONDUCTOR ELEMENT

[75] Inventors: Heinrich Schlangenotto, Neu-Isenburg; Friedhelm Sawitzki, Frankfurt am Main; Ronald Henson, Neu-Isenburg, all of Fed. Rep. of Germany

[73] Assignee: Licentia Patent-Verwaltungs-G.m.b.H., Fed. Rep. of Germany

[21] Appl. No.: 971,326

[22] Filed: Dec. 20, 1978

[30] Foreign Application Priority Data

Dec. 22, 1978 [DE] Fed. Rep. of Germany ....... 2757295

[51] Int. Cl.$^3$ ............................................. H01L 23/56
[52] U.S. Cl. ...................................... 357/28; 357/38; 357/51; 361/11; 361/58
[58] Field of Search ....................... 357/28, 38, 55, 51; 361/11, 58

[56] References Cited

U.S. PATENT DOCUMENTS

| 3,708,720 | 1/1973 | Whitney | 317/13 C |
| 3,893,154 | 7/1975 | Mroczek | 357/35 |

Primary Examiner—Martin H. Edlow
Attorney, Agent, or Firm—McGlew and Tuttle

[57] ABSTRACT

The negative temperature coefficient effect, which results in destructive current flow above a certain temperature in a semiconductor device is counteracted by a layer of conductive material that has low resistance at normal temperatures but has a positive temperature coefficient that causes its resistance to rise to a high value at temperatures below the certain temperature. The layer is applied to electrodes of semiconductor devices to control current flowing therethrough.

7 Claims, 5 Drawing Figures

SAFETY CIRCUIT FOR A SEMICONDUCTOR ELEMENT

BACKGROUND OF THE INVENTION

1. Field of the Invention

This invention relates to the protection of semiconductor devices from high temperature breakdown due to negative temperature coefficient (NTC) effects, in particular, it relates to the inclusion of positive temperature coefficient (PTC) material in a selective way to compensate for such NTC effects.

2. THE PRIOR ART

Gate-turn-off thyristors (GTO thryistors) for higher currents can be easily thermally destroyed during the turn-off process. If the turn-off in a part of the branched cathode structure is impeded, the forward current still flowing is conducted preferably in this location or part of the cathode. The resulting temperature increase leads to a reduction of the turn-off gain and of the forward voltage at the respective point or location which results in a further concentration of the current at the points of elevated temperature. Both effects lead to an increase of the turn-off power loss and thus to a further temperature increase. What can then happen is that the available turn-off gate current, at the respective point or location no longer suffices to interrupt the current flow. If the temperature of the semiconductor structure rises to about 130° C., interrupting the current, when higher voltages are applied, is no longer possible. This is true since the forward biasing capability is increasingly lost at temperatures starting at about 125° C. and rising about this valve.

If the point or location that experiences the increased temperature is small in size, this can finally lead to the destruction of the semiconductor structure because of the resulting high current density.

Thyristors, semiconductor rectifiers, and transistors can also be thermally destroyed by overly high forward current densities or surge current loads, which can cause local melting of the silicon or of adjoining silicon-metal eutectics. It is assumed that the destructive mechanism at work involves the fact that, the temperature first reaches such high values, as a result of the power loss, that the intrinsic concentration in this heated area rises to the order of the injected charge carrier concentration, and thus contributes substantially to the current in this area. In this way, the temperature dependence of the resistance of the semiconductor element changes from the usual increase with rising temperature to the abnormal decrease with rising temperature. In other words, the semiconductor element changes from the PTC resistance range to the NTC resistance range. The inversion temperature is generally between 500° and 650° C. in silicon power rectifiers and thyristors. In the NTC resistance range, a slight current increase leads to a further local current rise, due to the reduction of the resistance as a result of the temperature increase. With a given total current, this results in a current constriction, which can lead to the thermal destruction of the semiconductor element. This is enhanced or caused by inhomogeneities in the semi-conductor element material, which cause the current density to be increased at certain points of the semiconductor element. Such points include those where the carrier life is longer than normal and the like. Even if the semiconductor material does not melt, the semiconductor element can still become brittle and inoperative under repeated load, due to the high mechanical stresses caused by the inhomogeneity of the temperature.

SUMMARY OF THE INVENTION

The invention, as it relates to GTO thyristors, is based on the problem of avoiding a reduction in the forward blocking capability and an excessive drop in the turn-off gain due to the local rise in temperature of the semiconductor structure, to above about 80° C. In transistors the invention prevents destruction caused by the second breakdown occurring at reverse bias of the collector junction. In semiconductor rectifiers and in thyristors the invention makes it possible to increase, in general, the surge current limit above which a local thermal destruction can be expected.

The advantage achieved by the invention consists particularly in preventing the semiconductor element from getting into a working range, through locally increased temperature, that would cause its operability as a blocking element to be lost or destroyed. In the case of GTO thyristors, a decrease in the turn-off gain is reduced by avoiding temperature peaks.

The invention will be described more fully below on the basis of embodiments represented schematically in the drawings.

DETAILED DESCRIPTION OF THE PREFERRED EMBODIMENTS

Figure 1:
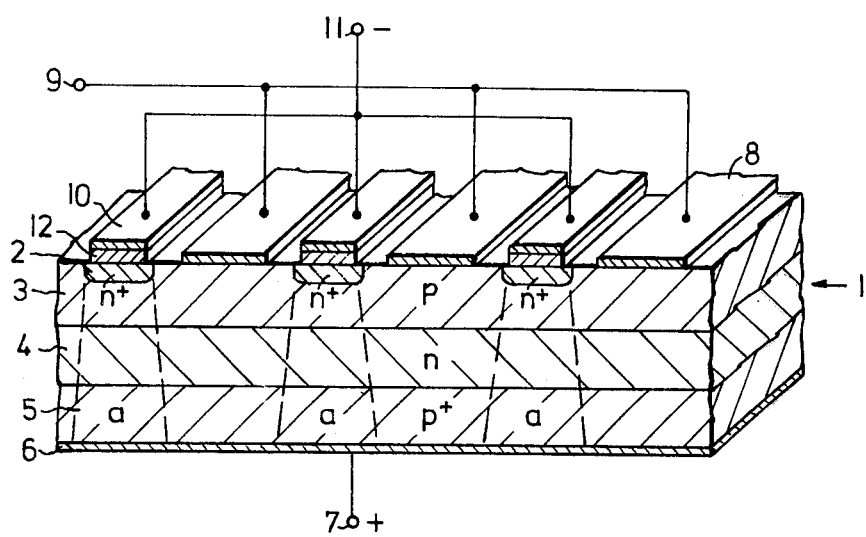
FIG. 1 shows the design of a GTO-thyristor with a protective PTC resistor layer.

FIG. 1 shows a section of a GTO-thyristor 1, whose cathode structure consists of a plurality of n+ emitter layers 2, for example, in strip form, which are diffused into a gated p-type base layer 3. The layer, in turn, is joined by an n-main base layer 4 and to a p+ emitter layer 5, the opposite surface of which is covered with a metal electrode 6, having an anode terminal 7. On the surface of the p-type base layer 3, metallic lamellar control electrodes 8, in strip form, are arranged between the n+ emitter layers 2 and are connected in parallel. A gate current is fed by way of a terminal 9 to the electrodes 8 to make the thyristor conductive and non-conductive. Deposited with the n+ emitter layers 2 are metal cathode electrodes 10, which are likewise connected in parallel to a cathode terminal 11. The thyristor without its contact metal layers is termed a semiconductor structure for the purposes of this application.

The above-described semiconductor element is already known.

According to the invention, protective PTC-resistor layers 12 are arranged between the n+ emitter layers 2 and the lamellar cathode electrodes 10.

The resistance behavior of the protective PTC resistor layers 12 is selected so that their resistance is negligible at room and normal operating temperature, so that the application of a gate current to the control electrodes 8 switches the device without causing any interference.

The forward load current flows mainly in the regions a represented between broken lines in FIG. 1, which can be overheated and thus lead to the destruction of the semiconductor structure. The protective PTC-resistor layer prevents such local heating of the semiconductor structure and thus prevents an inhomogeneous current distribution.

Figure 2:
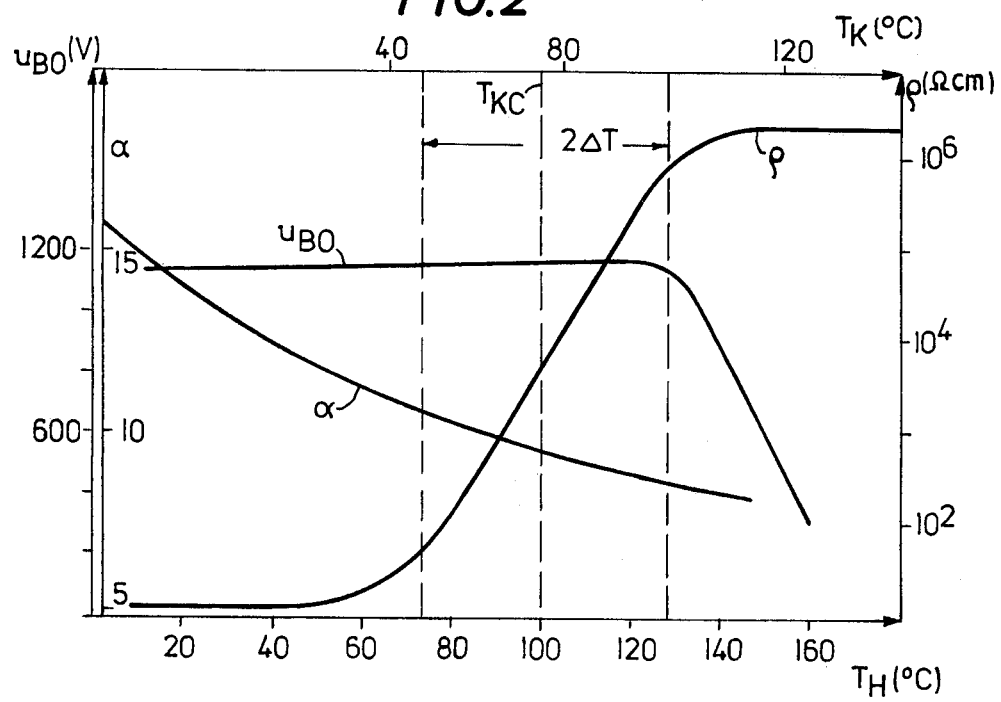
FIG. 2 shows a diagram of the course of the blocking capability and turn-off gain of a GTO thyristor, as well as the specific resistance of the protective PTC resistor layer.

As can be seen from the diagram in FIG. 2, the resistance ρ (Greek rho) of the protective PTC-resistor layer is very low, up to about 60° C., and then rises sharply in the range from 60° to 120° C. and remains substantially constant above 120° C.

The forward blocking capability μ-BO of 1200 V, for example, drops sharply above 120° C. The turn-off gain α decreases with rising temperature.

The specific resistance ρ of the protective PTC-resistor layer increases at low current densities by several decimal powers.

If the semiconductor structure is heated locally by the flowing load current to a temperature above 60° C., the resistance of the protective layer increases proportionally, thus reducing the current locally and preventing the semiconductor structure from becoming locally heated to a temperature above 125° C.

Figure 3:
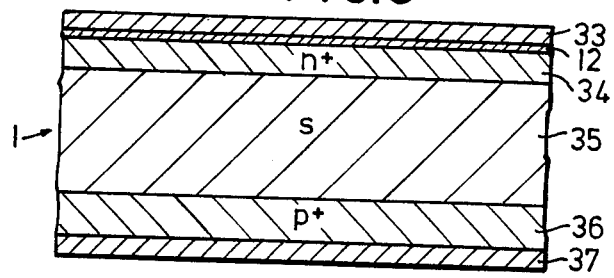
FIG. 3 shows the design of an n+sp+rectifier with a protective PTC resistor layer.
Figure 4:
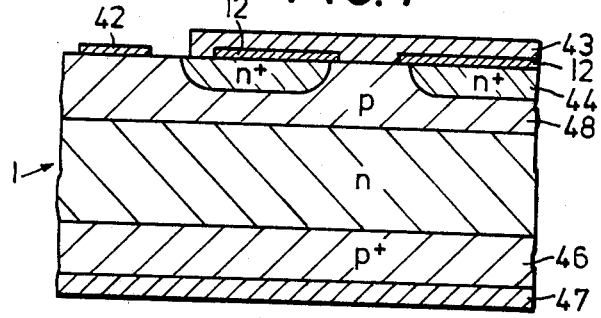
FIG. 4 shows the design of an n+pnp+thyristor PTC resistor coat.

FIG. 3 shows a part of a semiconductor-rectifier, and FIG. 4 a part of a shorted thyristor with a protective PTC-resistor layer which is so dimensioned that an increase of the surge current capability is achieved.

In the embodiment in FIG. 3, the protective PTC-resistor layer 12 is applied on the n+ layer 34 at the cathode side, which is on s layer 35. Layer 35 is on a p+ layer 36, and the whole structure has metallic cathode and anode electrodes 33 and 37, respectively. In structures without the alloyed base plate 37, the protective PTC-resistor layer 12 can also be arranged on the p+ emitter layer 36 or on both sides (34 and 36) of the structure.

In the thyristor according to FIG. 4, which has a cathode 43 and an anode 47, the p-phase layer 48 is shorted by the cathode metallization 43. The protective PTC-resistor layer 12, which is shown covered, can be removed to this end over the inner part of the areas where the p-base layer 48 abuts on the surface, by marking and etching with hydrofluoric acid. The thyristor is controlled by means of the gate electrode 42. The construction in FIG. 4, without the protective PTC resistor layer 12, is well known.

Figure 5:
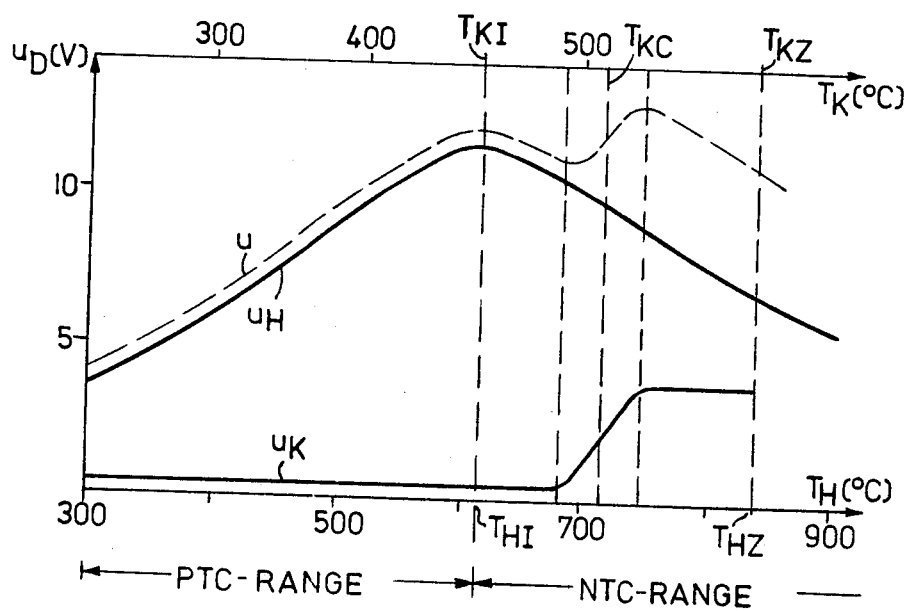
FIG. 5 shows a diagram of the course of the forward voltage drop of a thyristor.

In FIG. 5, the voltage drop uH in semiconductor structure 1, the voltage drop uK in the protective PTC resistor layer 12, and the voltage drop u in the combined semiconductor structure and protective PTC resistor layer, are shown as a function of the mean semiconductor temperature $T_H$ and of the temperature $T_K$ of the protective PTC resistor layer. Furthermore the PTC and the NTC resistance range are indicated. The inversion or critical temperature (from PTC to NTC ranges) is shown at $T_{HI}$. The destruction temperature is at $T_{HZ}$ and these two temperatures correspond to the lower $T_{KI}$ and $T_{KZ}$ temperatures of the PTC layer. TKC denotes the critical temperature of the protective PTC resistor layer.

The protective PTC resistor layer 12 is so dimensioned that, under a forward current load, the voltage drop uK in the protective PTC resistor layer 12 is at first small, compared to the forward voltage uH of the semiconductor structure. When the semiconductor structure is heated by the power loss up to the NTC resistance range, the voltage drop in the uK in the protective PTC resistor layer increases more than the forward voltage uH of the semiconductor structure decreases, starting from a certain semiconductor temperature, which also determines the temperature $T_K$ of the protective PTC resistor layer. If a current constriction occurs under a high current load, at which the protective PTC resistor layer is heated locally up to the range of the resistance increase in the proximity of $T_{KC}$, further current constriction and temperature increase, resulting in destruction, do not take place at that point. The current can then be increased, without destruction of the device, to a value at which the entire semiconductor is heated with uniform distribution so that the protective PTC resistor layer uniformly attains the temperature $T_{KC}$.

In order to obtain an effective protection, the protective PTC resistor layer 12 must meet the following requirements:

1. The voltage drop uK under forward load should be small below the resistance increase relative to the forward voltage uH of the semiconductor structure.

2. The resistance in a direction parallel to the protective PTC resistor layer must still be so great, even below the PTC resistance range, that the hot point cannot be loaded substantially with current from the side through the protective PTC resistor layer when there is current constriction.

3. The temperature $T_{KC}$ of the protective PTC resistor layer, in the proximity of which the resistance of the protective PTC resistor layer rises greatly, must be below the destruction temperature (on the surface of the semiconductor structure), but above the temperature of the device, (e.g. inversion temperature), where local destruction will very likely occur when this temperature is exceeded. If the semiconductor structure is adjoined by metal eutectics as contact layers, the temperature $T_{KC}$ must be below their melting temperature.

In the mechanism of the current constriction due to heating up to the range of the intrinsic conduction, the temperature $T_{KC}$ must be such that the semiconductor structure is already so intrinsically conductive at the PTC resistor temperature $T_{KC}$ that the semiconductor structure has, with a protective PTC resistor layer, a resistance with a negative temperature coefficient. The voltage drop in the protective PTC resistor layer should then increase at a current density to such an extent with the temperature that the total voltage drop u in the protective PTC resistor layer and in the semiconductor structure, increases from then on with the temperature. The temperature $T_{KC}$ of the protective PTC resistor coat is preferably in the range of about 300° to 600° C.

4. Conduction of heat should be hindered as little as possible by the protective PTC resistor layer.

The protective PTC resistor layer is logically also applicable to conventional thyristors, to avoid local thermal destruction during the current flow.

Ferro-electric ceramic materials can be used as a protective PTC resistor layer, particularly mixtures of barium titanate with lead or strontium titanate, where the resistance rises greatly after exceeding the Curie temperature. By selecting the composition of $Pb_xBa_{1-x}TiO$-mixed crystals, the Curie point can be selected in the range of 120° to 490° C., so that the temperature $T_{KC}$, in the proximity of which the resistance rises greatly, can also be set in a wide range.

Ceramic materials of this type can be sputtered on in thin layers of 0.2 to 0.3 μm thickness, for example, on a silicon substrate, or applied in any other way. To make sure that the PTC resistor effect is sufficiently pronounced, the thickness of the layer should be at least three crystallite layers.

Materials suitable for the metallization of the protective PTC resistor layer are reducing metals, like Zn, Sn, and Fe.

Several protective PTC resistor layers can also be superposed for the protection of the semiconductor structure. With two layers, one protective PTC resistor layer is so designed, for example, that it effects stabilization of the temperature and current in the range below 100° C., while the other protective PTC resistor layer effects stabilization at higher temperatures.

What is claimed is:

1. A thermally protected semi-conductor element comprising, a plurality of connected semi-conductor layers forming a semi-conductor structure having at least two surfaces, a metal contact layer for supplying current to said surfaces connected to each of said surfaces for establishing a "on" condition in said semi-conductor structure, and a positive temperature coefficient resistor layer directly connected to one of said surfaces and one of said metal contact layers, said positive temperature coefficient resistor layer disposed between said one surface and said one metal contact layer and made of a material having the characteristics of causing a relatively low voltage drop thereacross at temperatures below a critical temperature of said resistor layer and said semi-conductor structure when said semi-conductor structure is in the "on" state, and an increasing voltage drop thereacross at temperatures above the critical temperature sufficient to prevent the temperature to increase to a destruction temperature sufficient to damage said semi-conductor structure.

2. The semi-conductor element of claim 1 in which said positive temperature coefficient resistor layer extends parallel to said one surface of said semi-conductor structure for a distance much greater than the thickness of said resistor layer, and said resistor layer has a resistance in the direction parallel to said one surface sufficiently high to prevent heating of any point of said one surface to the destructive temperature.

3. A semi-conductor element according to claim 1, comprising a gate turn-off thyristor in which the temperature range of the rising voltage drop of the positive temperature coefficient resistor layer is below a temperature at which a forward loadability of a semi-conductor drops.

4. A gate turn-off thyristor according to claim 3 in which the range of the rising voltage drop of the positive temperature coefficient resistor layer is between an inversion temperature and the destruction temperature of the semiconductor structure.

5. A semiconductor element according to claim 3, in which said positive temperature coefficient resistor layer comprises ferro-electric ceramic material.

6. A semiconductor element according to claim 3, in which said positive temperature coefficient resistor layer comprises a ferro-electric ceramic material comprising a mixture of barium titanate with a member of the group consisting of lead titanate and strontium titante, said mixture having a Curie point in the range of 120° to 490° C.

7. A semiconductor element according to claim 3 comprising a second positive temperature coefficient resistor layer integrated with said semiconductor structure and having a temperature coefficient different from the temperature coefficient of the first named positive temperature coefficient resistor layer.

* * * * *